(12) United States Patent
Liu et al.

(10) Patent No.: US 7,221,584 B2
(45) Date of Patent: May 22, 2007

(54) MRAM CELL HAVING SHARED CONFIGURATION

(75) Inventors: Chi-Wen Liu, Hsinchu (TW);
Kuo-Ching Chiang, Tao-Yuan (TW);
Horng-Huei Tseng, Hsin-Chu (TW);
Denny D. Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 186 days.

(21) Appl. No.: 11/053,379

(22) Filed: Feb. 8, 2005

(65) Prior Publication Data

US 2006/0033133 A1    Feb. 16, 2006

Related U.S. Application Data

(60) Provisional application No. 60/601,281, filed on Aug. 13, 2004.

(51) Int. Cl.
| | |
|---|---|
| *G11C 11/00* | (2006.01) |
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |

(52) U.S. Cl. .................... 365/158; 257/295
(58) Field of Classification Search ............... 257/295; 365/158

See application file for complete search history.

(56) References Cited

U.S. PATENT DOCUMENTS

| | | | |
|---|---|---|---|
| 5,640,343 A | 6/1997 | Gallagher et al. | |
| 5,956,267 A | 9/1999 | Hurst et al. | |
| 6,005,800 A | 12/1999 | Koch et al. | |
| 6,097,625 A | 8/2000 | Scheuerlein | |
| 6,114,719 A | 9/2000 | Dill et al. | |
| 6,272,041 B1 | 8/2001 | Naji | |
| 6,317,375 B1 | 11/2001 | Perner | |
| 6,331,943 B1 | 12/2001 | Naji et al. | |
| 6,335,890 B1 | 1/2002 | Reohr et al. | |
| 6,356,477 B1 | 3/2002 | Tran | |
| 6,368,878 B1 | 4/2002 | Abraham et al. | |
| 6,417,561 B1 | 7/2002 | Tuttle | |
| 6,430,084 B1 | 8/2002 | Rizzo et al. | |
| 6,475,812 B2 | 11/2002 | Nickel et al. | |
| 6,490,217 B1 | 12/2002 | DeBrosse et al. | |
| 6,509,621 B2 | 1/2003 | Nakao | |
| 6,515,897 B1 | 2/2003 | Monsma et al. | |
| 6,522,579 B2 | 2/2003 | Hoenigschmid | |
| 6,525,957 B1 | 2/2003 | Goronkin et al. | |
| 6,555,858 B1 | 4/2003 | Jones et al. | |

(Continued)

OTHER PUBLICATIONS

A. Anguelouch et al., "Two-dimensional magnetic switching of micron-size films in magnetic tunnel junctions", Applied Physics Letters, Jan. 31, 2000, pp. 622-624, vol. 76, No. 5, American Institute of Physics.

(Continued)

*Primary Examiner*—Howard Weiss
(74) *Attorney, Agent, or Firm*—Haynes and Boone, LLP (57) ABSTRACT

A magnetic memory includes two first magnetic layers each oriented over a substrate, a second magnetic layer interposing the two first magnetic layers, and two dielectric layers each contacting the second magnetic layer and interposing the second magnetic layer and one of the two first magnetic layers. Each of the first and second magnetic layers and the dielectric layers may be oriented substantially perpendicular to the substrate or at an acute angle relative to the substrate.

26 Claims, 6 Drawing Sheets

U.S. PATENT DOCUMENTS

| | | |
|---|---|---|
| 6,556,473 B2 | 4/2003 | Saito et al. |
| 6,567,299 B2 | 5/2003 | Kunikiyo et al. |
| 6,590,803 B2 | 7/2003 | Saito et al. |
| 6,594,191 B2 | 7/2003 | Lammers et al. |
| 6,611,453 B2 | 8/2003 | Ning |
| 6,621,730 B1 * | 9/2003 | Lage .......................... 365/158 |
| 6,621,731 B2 | 9/2003 | Bessho et al. |
| 6,661,689 B2 | 12/2003 | Asao et al. |
| 6,667,899 B1 | 12/2003 | Subramanian et al. |
| 6,693,822 B2 | 2/2004 | Ito |
| 6,693,826 B1 | 2/2004 | Black, Jr. et al. |
| 6,967,864 B2 * | 11/2005 | Kajiyama ................... 365/158 |
| 2002/0105827 A1 | 8/2002 | Redon et al. |
| 2003/0048676 A1 | 3/2003 | Daughton et al. |
| 2003/0086313 A1 | 5/2003 | Asao |

OTHER PUBLICATIONS

F. Montaigne, et al., "Enhanced Tunnel Magnetoresistance at High Bias Voltage in Double-Barrier Plannar Junctions", vol. 73, No. 19, Nov. 9, 1998, American Institute of Physics, pp. 2829-2831.

Y. Saito, et al., Correlation Between Barrier Width, Barrier Height, and DC Bias Voltage Dependences on the Magnetoresistance Ratio in IR-MN Exchanged Biased Single and Double Tunnel Junctions, vol. 39, pp. L1035-L1038, Part 2, No. 10B, Oct. 2000, The Japan Society of Applied Physics.

* cited by examiner

MRAM CELL HAVING SHARED CONFIGURATION

RELATED APPLICATIONS

The present application claims the benefit of U.S. Provisional Application having Ser. No. 60/601,281, filed Aug. 13, 2004, the entire contents of which are hereby incorporated by reference herein.

The present application is also related to U.S. application Ser. No. 10/917,585, entitled "MRAM OVER SLOPED PILLAR," filed on Aug. 13, 2004, having common inventorship and ownership as the present application, the entire contents of which are hereby incorporated by reference herein.

BACKGROUND

A magnetic random access memory (MRAM) device may include an MRAM stack having a dielectric layer interposing a fixed or pinned magnetic layer and a free magnetic layer. Each of the MRAM stack layers is substantially planar and oriented parallel to a surface over which the MRAM device is formed. However, cell density of integrated circuits and other devices incorporating one or more such MRAM devices is limited by the parallel orientation of the MRAM stack layers and the predetermined amount of surface area required at the interfaces between the MRAM stack layers (i.e., the lateral dimensions of each MRAM stack).

However, merely turning the MRAM stacks on end does not provide sufficient cell density and complicates manufacturing. For example, some methods of forming vertical layers or other components can require a very limited process window, which may be deleterious to design robustness and product yield.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
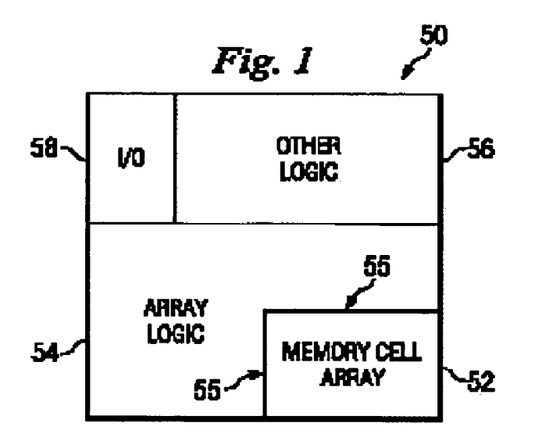
FIG. 1 is a block diagram of one embodiment of an integrated circuit device having a memory cell array according to aspects of the present disclosure.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. The integrated circuit can further include other logic 56, such as counters, clock circuits, and processing circuits, and input/output circuitry 58, such as buffers and drivers.

Figure 2:
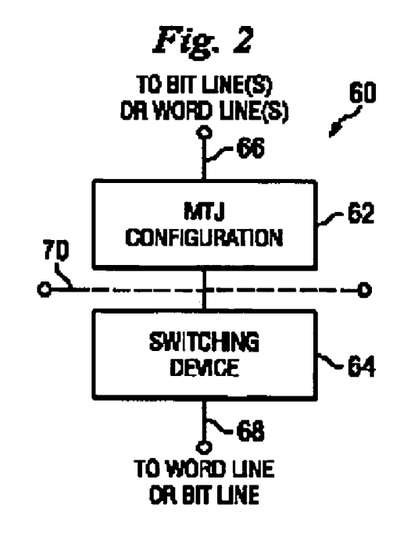
FIG. 2 is a block diagram of one embodiment of a memory cell for use in the memory cell array shown in FIG. 1 according to aspects of the present disclosure.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MRAM stacks in MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits.

The MRAM cell 60 may include three terminals, a first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Figure 3A:
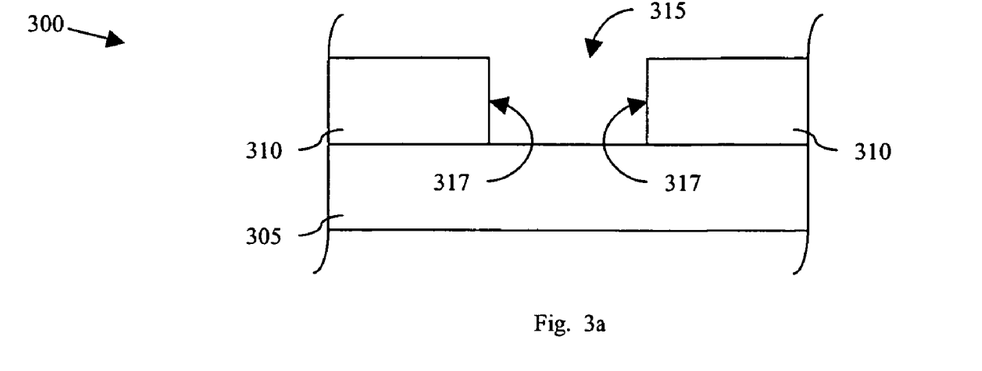
FIG. 3a is a sectional view of at least a portion of one embodiment of an apparatus in an intermediate stage of manufacture according to aspects of the present disclosure.

Referring to FIG. 3a, illustrated is a sectional view of at least a portion of one embodiment of an apparatus 300 in an intermediate stage of manufacture according to aspects of the present disclosure. The apparatus 300 includes a material layer 310 formed over a substrate 305. The material layer 310 may be formed directly on the substrate 305, or one or more other layers, features, or components may interpose the substrate 305 and the material layer 310.

The substrate 305 may comprise silicon, gallium arsenide, silicon germanium, and/or other materials. In one embodiment, the substrate 305 is or comprises a silicon-on-insulator (SOI) substrate, such as a substrate comprising an epitaxially grown or otherwise formed semiconductor layer on an insulator layer. The substrate 305 may also comprise one or more conductive and/or insulating layers located thereon, such as those that may be employed to form active and/or passive devices and/or an interconnect structure. Thus, reference herein to the substrate 305 may refer to a wafer on which a plurality of layers are formed, such as a silicon ingot wafer, and may also or alternatively refer to one or more such layers which may be formed on or over such a wafer.

The material layer 310 may comprise one or more electrically conductive materials such as aluminum, gold, tungsten, alloys thereof, and/or other electrically conductive materials. The material layer 310 may also or alternatively comprise one or more dielectric materials such as silicon dioxide, tetraethylorthosilicate (TEOS), glass, SILK (a product of Dow Chemical), BLACK DIAMOND (a product of Applied Materials), and/or other electrically insulating materials. The material layer 310 may also or alternatively comprise one or more magnetic materials, including ferromagnetic, anti-ferromagnetic, and/or hard-magnetic materials. For example, the material layer 310 may comprise NiFe, NiFeCo, CoFe, Fe, Co, Ni, alloys or compounds thereof, and/or other magnetic materials.

The material layer 310 may be formed by chemical-vapor deposition (CVD), rapid thermal CVD (RTCVD), plasma enhanced CVD (PECVD), and/or sputtering, possibly to a thickness ranging between about 50 nm and about 1000 nm, although other processes and thicknesses are also within the scope of the present disclosure. Formation of the material layer 310 may also include forming a trench, opening, or other type of recess (hereafter collectively referred to as a recess) 315 extending at least partially into or substantially through the material layer 310. For example, one or more selective deposition processes may be employed to form the material layer 310 and simultaneously define the recess 315. Alternatively, the material layer 310 may blanket deposited and subsequently patterned to form the recess 315, such as by one or more wet or dry etching processes. The recess 315 may have sidewalls 317 that are substantially perpendicular to the substrate 305, such as those which may result from one or more anisotropic etching processes employing an overlying patterned photoresist or other type of mask. However, the recess sidewalls 317 may be otherwise angularly offset from the substrate 305 to be non-parallel relative to the substrate 305.

Figure 3B:
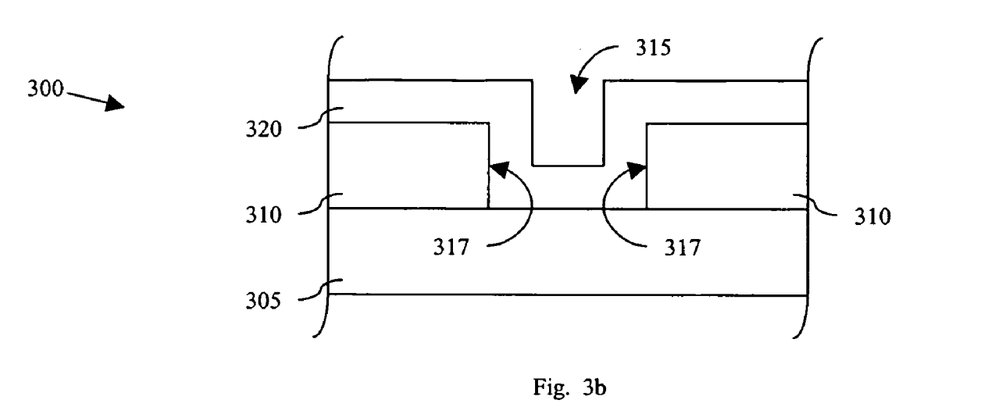
FIG. 3b is a sectional view of the apparatus shown in FIG. 3a in a subsequent stage of manufacture.

Referring to FIG. 3b, illustrated is a sectional view of the apparatus 300 shown in FIG. 3a in a subsequent stage of manufacture in which a magnetic material layer 320 has been formed over the material layer 310 and the recess sidewalls 317. However, if the material removal or other processes employed to define the recess 315 exposes a portion of the substrate 305, the magnetic material layer 320 may also be formed over the exposed substrate portion. The magnetic material layer 320 may have a thickness ranging between about 1 nm and about 20 nm, although other thickness are within the scope of the present disclosure. Also, while the magnetic material layer 320 is illustrated as being formed directly adjacent the recess sidewalls 317, other layers, features or components may interpose the recess sidewalls 317 and the magnetic material layer 320.

The magnetic material layer 320 may comprise NiFe, NiFeCo, CoFe, Fe, Co, Ni, alloys or compounds thereof, and/or other magnetic materials and, as such, may be employed to subsequently form a free or pinned magnetic layer. The magnetic material layer 320 may also comprise a plurality of layers, such as a Ru spacer interposing two or more magnetic layers or other combinations forming a synthetic anti-ferromagnetic (SAF) layer. Although not limited within the scope of the present disclosure, the magnetic material layer 320 may be formed by blanket deposition employing such processes as CVD, RTCVD, PECVD, sputtering, and/or other processes, including processes other than CVD-type processes.

Figure 3C:
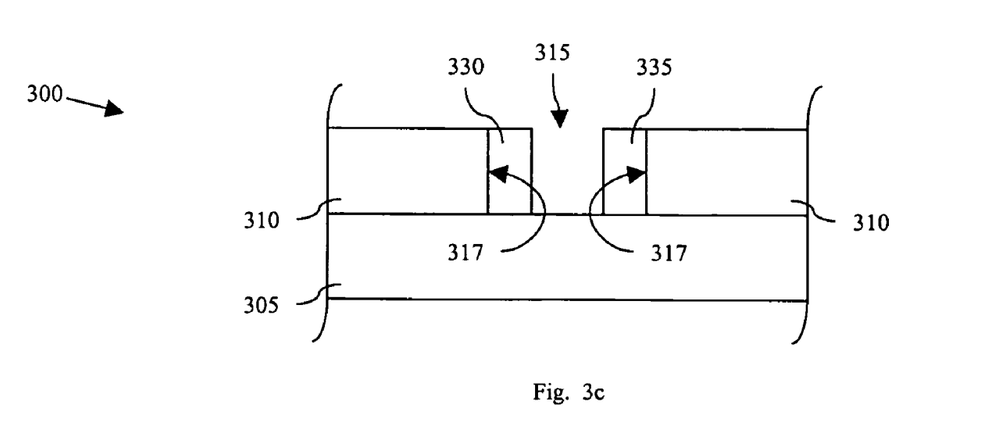
FIG. 3c is a sectional view of the apparatus shown in FIG. 3b in a subsequent stage of manufacture.

Referring to FIG. 3c, illustrated is a sectional view of the apparatus 300 shown in FIG. 3b in a subsequent stage of manufacture in which at least a portion of the magnetic material layer 320 has been removed to form magnetic MRAM stack layers 330, 335. For example, one or more isotropic and/or anisotropic etching processes may be performed to define the magnetic MRAM stack layers 330, 335, possibly employing a patterned photoresist or other mask. Chemical-mechanical polishing or planarizing (hereafter collectively referred to as CMP) may also be employed during the definition of the magnetic MRAM stack layers 330, 335. In some embodiments, the material layer 310 and/or the substrate 305 may be employed for end-point detection during the definition of the magnetic MRAM stack layers 330, 335 from the magnetic material layer 320. For example, in one embodiment, defining the magnetic MRAM stack layers 330, 335 comprises anisotropically etching the magnetic material layer 320 until the magnetic material layer 320 is substantially removed from the bottom of the recess 315 and subsequently planarizing (e.g., by CMP) the remaining portions of the magnetic material layer 320 until the magnetic material layer 320 is substantially removed from over the material layer 310.

By forming the magnetic MRAM stack layers 330, 335 according to aspects described above, the magnetic MRAM stack layers 330, 335 may substantially conform to the recess sidewalls 317. Moreover, because the magnetic MRAM stack layers 330, 335 may substantially conform to the recess sidewalls 317, the magnetic MRAM stack layers 330, 335 may also be oriented substantially perpendicular to the substrate 305. Of course, processes other than those described above may also or alternatively be employed to form the magnetic MRAM stack layers 330, 335. Nonetheless, in some embodiments, one or both of the distal ends of each of the magnetic MRAM stack layers 330, 335 may be substantially coplanar with or otherwise aligned with the upper and lower surfaces of the material layer 310 (relative to the illustration in FIG. 3c).

In some embodiments, the lateral surfaces of one or both of the magnetic MRAM stack layers 330, 335 may not be mutually substantially parallel or individually planar. In such embodiments, the perpendicular orientation of the magnetic MRAM stack layers 330, 335 relative to the substrate 305 may be measured from one of the sidewall surfaces of the corresponding one of the magnetic MRAM stack layers 330, 335 that is substantially planar. Such perpendicular orientation may also be measured from a best-fit plane of one of the sidewall surfaces of the corresponding one of the magnetic MRAM stack layers 330, 335 that may not be substantially planar. The perpendicular orientation may also be relative to a hypothetical center plane of the corresponding one of the magnetic MRAM stack layers 330, 335, wherein the center plane may represent a weighted or other average of the sidewall surfaces of the corresponding one of the magnetic MRAM stack layers 330, 335. In one embodiment, at least one of the recess sidewalls 317 may be substantially cylindrical, wherein the substantial perpendicularity thereof may be measured from the center-line axis of the cylindrical surface.

Figure 3D:
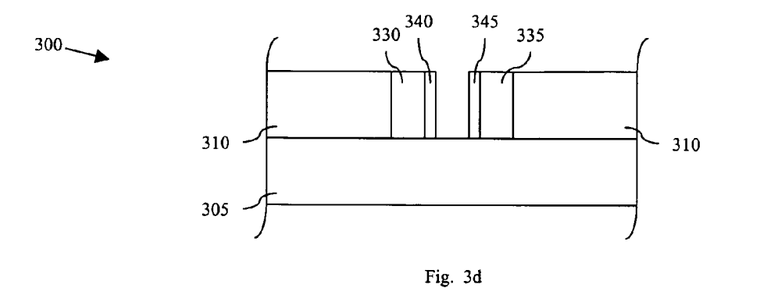
FIG. 3d is a sectional view of the apparatus shown in FIG. 3c in a subsequent stage of manufacture.

Referring to FIG. 3d, illustrated is a sectional view of the apparatus 300 shown in FIG. 3c in a subsequent stage of manufacture in which dielectric MRAM stack layers 340, 345 have been formed adjacent the magnetic MRAM stack layers 330, 335. The dielectric MRAM stack layers 340, 345 may be formed by one or more of the processes described above that may be employed to form the magnetic material layer 320. For example, the dielectric MRAM stack layers 340, 345 may be formed by a CVD or other deposition process followed by one or more etching and/or other material removal processes. In one embodiment, forming the dielectric MRAM stack layers 340, 345 comprises conformally depositing a dielectric material layer over the material layer 310 and in the recess 315, thereby lining the magnetic MRAM stack layers 330, 335, subsequently anisotropically etching the dielectric material layer until it is substantially removed from the bottom of the recess 315, and subsequently planarizing (e.g., by CMP) the remaining portions of the dielectric material layer until it is substantially removed from over the material layer 310. In one embodiment, a portion of the magnetic material layer 320 from which the magnetic MRAM stack layers 330, 335 are defined may remain on the material layer 310 when the dielectric material layer is conformally deposited, such that a planarizing process may remove portions of both the dielectric material layer and the magnetic material layer to expose the material layer 310.

The dielectric MRAM stack layers 340, 345 may also each comprise more than one layer. Also, while the dielectric MRAM stack layers 340, 345 are illustrated as being formed directly adjacent the magnetic MRAM stack layers 330, 335, other layers, features or components may interpose the dielectric MRAM stack layers 340, 345 and the magnetic MRAM stack layers 330, 335.

One or both of the dielectric MRAM stack layers 340, 345 may be a tunneling barrier layer or other dielectric layer. For example, the dielectric MRAM stack layers 340, 345 may comprise $SiO_x$, $SiN_x$, $SiO_xN_y$, $AlO_x$, $TO_x$, $TiO_x$, $AlN_x$, alloys or compounds thereof, and/or other electrically insulating materials. The dielectric MRAM stack layers 340, 345 may have a thickness ranging between about 0.5 nm and about 2 nm, possibly measured in a direction substantially perpendicular to one of the recess sidewalls 317. Moreover, the dielectric MRAM stack layers 340, 345 may substantially conform to a corresponding one of the magnetic MRAM stack layers 330, 335, such that the dielectric MRAM stack layers 340, 345 may also be oriented perpendicular relative to the substrate 305.

Figure 3E:
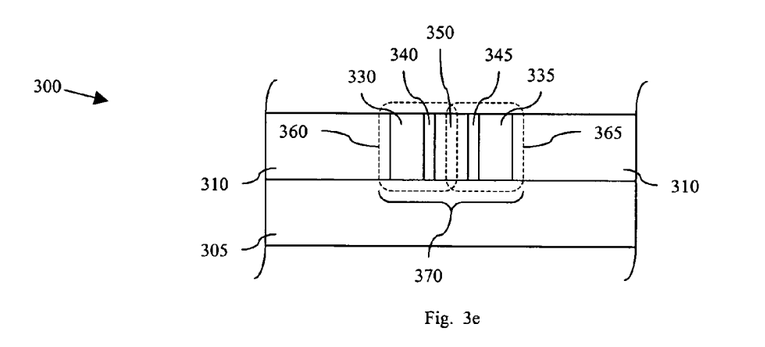
FIG. 3e is a sectional view of the apparatus shown in FIG. 3d in a subsequent stage of manufacture.

Referring to FIG. 3e, illustrated is a sectional view of the apparatus 300 shown in FIG. 3d in a subsequent stage of manufacture in which a magnetic MRAM stack layer 350 has been formed interposing and contacting the dielectric MRAM stack layers 340, 345. While the magnetic MRAM stack layer 350 is illustrated as being formed directly adjacent the dielectric MRAM stack layers 340, 345, other layers, features or components may interpose the magnetic MRAM stack layer 350 and one or both of the dielectric MRAM stack layers 340, 345. The magnetic MRAM stack layer 350 may be paired with each of the magnetic MRAM stack layers 330, 335 to form corresponding pairs of free and pinned magnetic MRAM stack layers, thereby forming MTJ MRAM stacks 360, 365, as described below.

The magnetic MRAM stack layer 350 may comprise NiFe, NiFeCo, CoFe, Fe, Co, Ni, alloys or compounds thereof, and/or other magnetic materials, including ferromagnetic or anti-ferromagnetic materials. The magnetic MRAM stack layer 350 may also comprise a plurality of layers, such as a Ru spacer interposing two or more magnetic layers or other combinations forming an SAF layer. The thickness (or width, in the illustrated embodiment) of the magnetic MRAM stack layer 350 may also be substantially similar to the thickness of the magnetic MRAM stack layers 330, 335. Although not limited within the scope of the present disclosure, the magnetic MRAM stack layer 350 may be substantially similar in manufacture to the magnetic MRAM stack layers 330, 335.

For example, the MRAM stack layer 350 may be formed by a CVD or other deposition process followed by one or more etching and/or other material removal processes. In one embodiment, forming the dielectric MRAM stack layer 350 comprises depositing an additional magnetic material layer over the material layer 310 and substantially filling the remaining unoccupied portion of the recess 315, and subsequently planarizing (e.g., by CMP) the remaining portions of the additional magnetic material layer until the additional magnetic material layer is substantially removed from over the material layer 310. In one embodiment, a portion of the magnetic material layer 320 from which the magnetic MRAM stack layers 330, 335 are defined, and/or the dielectric material layer from which the dielectric MRAM stack layers 340, 345 are defined, may remain on the material layer 310 when the additional magnetic material layer is conformally deposited, such that a subsequent planarizing process (e.g., cMP) may remove portions of the magnetic material layer 320, the above-described dielectric material layer, and/or the additional magnetic material layer, thereby exposing the material layer 310.

The magnetic MRAM stack layer 350 may substantially fill the remaining unfilled portion of the recess 315 or otherwise substantially conform to a corresponding one of the dielectric MRAM stack layers 340, 345, such that the magnetic MRAM stack layer 350 may be similarly oriented substantially perpendicular relative to the substrate 305. Consequently, the MRAM stacks 360, 365 may also be oriented substantially perpendicular relative to the substrate 305.

The completion of the magnetic MRAM stack layer 350 may substantially complete MRAM stacks 360, 365, and the MRAM stacks may substantially compose a dual-bit MRAM cell 370. In the illustrated embodiment, the MRAM stack 360 comprises the magnetic MRAM stack layer 330, the dielectric MRAM stack layer 340, and the magnetic MRAM stack layer 350. Similarly, the illustrated MRAM stack 365 comprises the magnetic MRAM stack layer 335, the dielectric MRAM stack layer 345, and the magnetic MRAM stack layer 350. Accordingly, the magnetic MRAM stack layer 350 may be shared by both MRAM stacks 360, 365, whereas the magnetic MRAM stack layers 330, 335 are dedicated magnetic layers of a corresponding one of the MRAM stacks 360, 365.

Each of the magnetic MRAM stack layers 330, 335, 350 may be a free magnetic layer or a fixed or pinned magnetic layer. For example, if the magnetic MRAM stack layer 330 is a free magnetic layer, then the magnetic MRAM stack layer 335 may also be a free magnetic layer, and the magnetic MRAM stack layer 350 may be a fixed or pinned magnetic layer. However, if the magnetic MRAM stack layer 330 is a fixed or pinned magnetic layer, then the magnetic MRAM stack layer 335 may also be a fixed or pinned magnetic layer, and the magnetic MRAM stack layer 350 may be a free magnetic layer. Thus, the MRAM cell 370 may be a dual-bit MRAM cell because the magnetic tunnel junction established by corresponding fixed and free magnetic layers opposing a tunnel barrier dielectric layer of each of the MRAM stacks 360, 365 is capable of storing an information bit (a "0" or a "1") which may be subsequently accessed. Of course, in some embodiments, the MRAM stacks 360, 365 may comprise alternative or additional layers. Moreover, the above-described aspects of manufacturing the dual-bit MRAM cell 370 are also applicable or readily adaptable to multi-bit MRAM cells.

Figure 4:
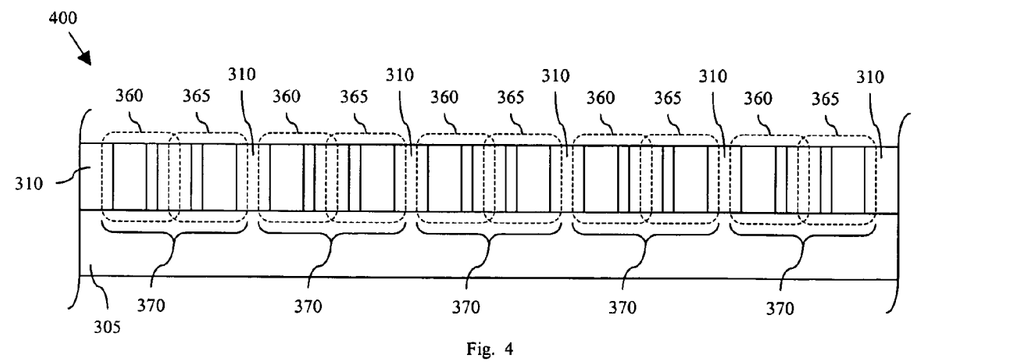
FIG. 4 is a sectional view of at least a portion of another embodiment of the apparatus shown in FIG. 3e.

Referring to FIG. 4, illustrated is a sectional view of at least a portion of another embodiment of the apparatus 300 shown in FIG. 3e, herein designated by the reference number 400. The apparatus 400 is substantially similar to the apparatus 300 shown in FIG. 3e. However, the apparatus 400 includes multiple instances of the dual-bit MRAM cell 370, each including an MRAM stack 360 and an MRAM stack 365. Each of the dual-bit MRAM cells 370 may be physically and/or electrically isolated from neighboring dual-bit MRAM cells 370 by a portion of the material layer 310. Alternatively, two or more neighboring ones of the MRAM cells 370 may be electrically connected by an electrically conductive portion of the material layer 310.

Each of the dual-bit MRAM cells 370 may be formed substantially simultaneously or at different times or stages in a manufacturing process flow. Each of the dual-bit MRAM cells 370 may also be substantially coplanar with neighboring dual-bit MRAM cells 370, although other configurations are also within the scope of the present disclosure. Each of the dual-bit MRAM cells 370 may also be substantially similar in size and composition, although such limitation is not required in every embodiment within the scope of the present disclosure.

Figure 5:
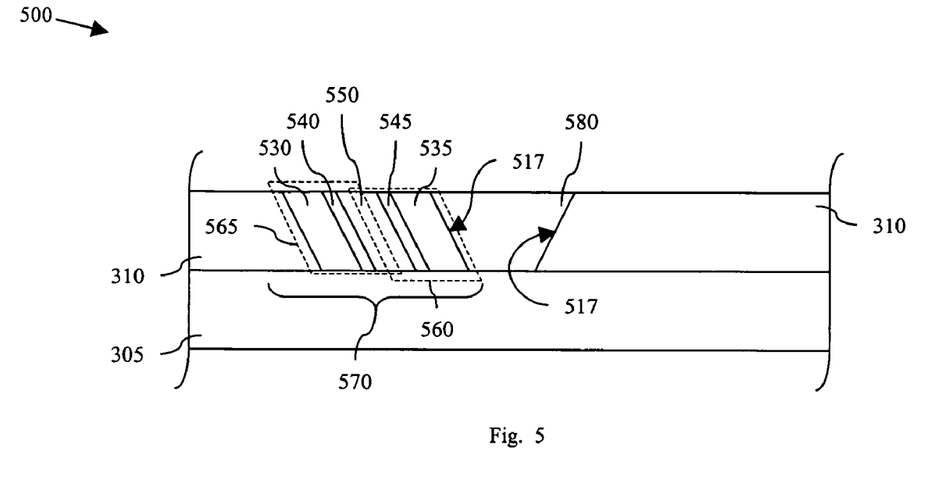
FIG. 5 is a sectional view of at least a portion of another embodiment of the apparatus shown in FIG. 3e.

Referring to FIG. 5, illustrated is a sectional view of at least a portion of another embodiment of the apparatus 300 shown in FIG. 3e, herein designated by the reference number 500. The apparatus 500 is substantially similar to the apparatus 300 shown in FIG. 3e. However, although otherwise substantially similar to corresponding ones of the magnetic MRAM layers 330, 335, 350 and the dielectric MRAM layers 340, 345, each of the magnetic MRAM layers 530, 535, 550 and the dielectric MRAM layers 540, 545 in the apparatus 500 are oriented at an acute angle relative to the substrate 305. For example, in the illustrated embodiment, each of the MRAM layers 530, 535, 540, 545, 550 are oriented at about 60 degrees relative to the substrate 305. In other embodiments, the angular offset of the MRAM layers 530, 535, 540, 545, 550 may range between about 60 degrees and about 88 degrees, although other angles are within the scope of the present disclosure.

In addition, the material removal processing employed to remove a portion of the material layer 310 to form recess sidewalls 517 may differ from the processing employed to form the recess sidewalls 317 shown in FIG. 3e in that the recess sidewalls 517 are angularly offset relative to the substrate 305 by an acute angle. As with the recess sidewalls 317, each of the recess sidewalls 517 may be substantially planar, substantially cylindrical, and/or otherwise shaped within the scope of the present disclosure.

In one embodiment, the angularly offset recess sidewalls 517 may be formed by an isotropic etch, possibly employing a patterned photoresist or other type of mask over the material layer 310. The recess sidewalls 517 may also or alternatively be formed by an etching process employing a patterned photoresist layer over the material layer 310 and having a sloped profile that is substantially similar to the desired sloped profile of the recess sidewalls 517. The recess sidewalls 517 may also or alternatively be formed by gradually or incrementally altering process pressure during dry etch processing to achieve the desired profile of the recess sidewalls 517. Of course, other process parameters may also or alternatively be adjusted during formation of the recess sidewalls 517, such as the concentration of one or more process gas constituents, wherein the process gas may comprise two, three, four, or more different gases or constituents.

Moreover, because conformal deposition and subsequent etching processes may be employed to form the layers of the MRAM stacks 560, 565, the conformally deposited material layers from which the layers of the MRAM stacks 560, 565 are defined may initially be formed on both of the recess sidewalls 517. Consequently, the etch processing that may be employed to define the layers of the MRAM stacks 560, 565 from the material layers may also be employed to remove portions of the material layers from one of the recess sidewalls 517, resulting in the embodiment illustrated in FIG. 5.

Upon completion of the MRAM stacks 560, 565, a fill member 580 may be formed in the remaining recess between the recess sidewalls 517 that is not occupied by the MRAM stacks 560, 565. The fill member 580 may be formed by CVD, RTCVD, PECVD, and/or sputtering, possibly to a thickness that is substantially similar to the thickness of the material layer 310, although other processes and thickness are within the scope of the present disclosure. CMP or other planarizing processes may also be employed such that the fill member 580 is substantially coplanar with the material layer 310 and/or the MRAM stacks 560, 565 (relative to the illustration in FIG. 5).

The fill member 580 may comprise one or more electrically conductive materials such as aluminum, gold, tungsten, alloys thereof, and/or other electrically conductive materials. The fill member 580 may also or alternatively comprise one or more dielectric materials such as silicon dioxide, TEOS, glass, SILK, BLACK DIAMOND, and/or other electrically insulating materials. The fill member 580 may also or alternatively comprise one or more magnetic materials, including ferromagnetic, anti-ferromagnetic, and/or hard-magnetic materials. For example, the fill member 580 may comprise NiFe, NiFeCo, CoFe, Fe, Co, Ni, alloys or compounds thereof, and/or other magnetic materials. The composition of the fill member 580 may be selected based on the desired functionality of the fill member 580. For example, if the fill member 580 is to be employed in the interconnection of the dual-bit MRAM cell 570 to other MRAM cells or other microelectronic devices, the fill member 580 may substantially comprise electrically conductive material.

Figure 6:
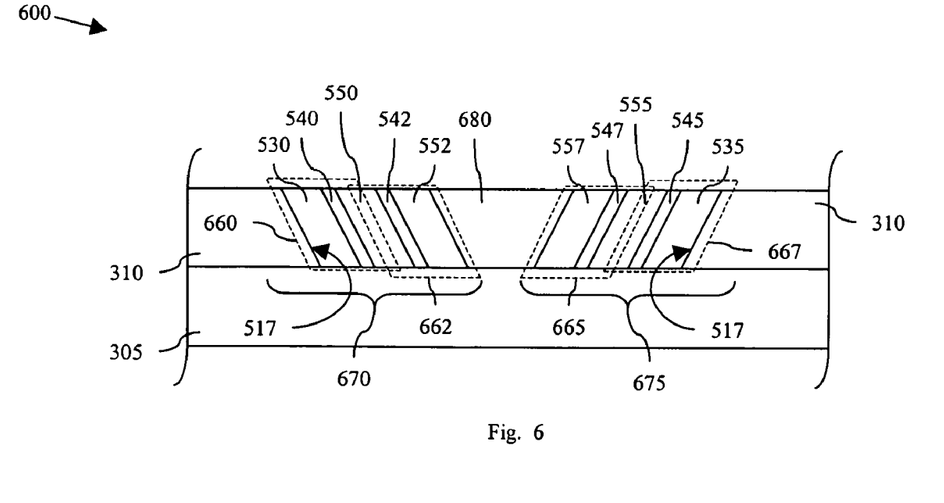
FIG. 6 is a sectional view of at least a portion of another embodiment of the apparatus shown in FIG. 5.

Referring to FIG. 6, illustrated is a sectional view of at least a portion of another embodiment of the apparatus 500 shown in FIG. 5, herein designated by the reference numeral 600. The apparatus 600 includes one or more MRAM stacks 660, 662, 665, 667. In the illustrated embodiment, the MRAM stacks 660, 662 may each be substantially similar in composition and manufacture to the MRAM stacks 560, 5654 shown in FIG. 5, and each of the MRAM stacks 665, 667 may substantially be mirror images of the MRAM stacks 660, 662. Also, although illustrated as including four MRAM stacks 660, 662, 665, 667, or two MRAM cells 670, 675, other embodiments of the apparatus 600 may include fewer or greater numbers of MRAM stacks or MRAM cells than as shown in FIG. 6.

The MRAM stacks 660, 662, 665, 667 may be formed, for example, by alternating conformal deposition and etching processes to form successive layers over the recess sidewalls 517. For example, a magnetic material layer may be conformally deposited and subsequently etched to define the magnetic MRAM layers 530, 535, and a dielectric material layer may be conformally deposited and subsequently etched to define the dielectric MRAM layers 540, 545. An additional magnetic material layer may be conformally deposited and subsequently etched to define the magnetic MRAM layers 550, 555, each of which may be a shared magnetic MRAM layer in the MRAM cells 670, 675, respectively. An additional dielectric material layer may be conformally deposited and subsequently etched to define dielectric MRAM layers 542, 547, and an additional magnetic material layer may be optionally deposited and subsequently etched to define magnetic MRAM layers 552, 557.

Thus, the MRAM stack 660 may comprise the magnetic MRAM layers 530, 550 and the dielectric MRAM layer 540, and the MRAM stack 662 may comprise the magnetic MRAM layers 550, 552 and the dielectric MRAM layers 542, thereby at least partially composing dual-bit MRAM cell 670 in which the magnetic MRAM layer 550 is shared between the MRAM stacks 660, 665 and the magnetic MRAM layers 530, 552 are dedicated to corresponding ones of the MRAM stacks 660, 665. Similarly, the MRAM stack 665 may comprise the magnetic MRAM layers 535, 555 and the dielectric MRAM layer 545, and the MRAM stack 667 may comprise the magnetic MRAM layers 555, 557 and the dielectric MRAM layer 547, thereby at least partially composing dual-bit MRAM cell 675 in which the magnetic MRAM layer 555 is shared between the MRAM stacks 662, 667 and the magnetic MRAM layers 535, 557 are dedicated to corresponding ones of the MRAM stacks 662, 667.

The apparatus 600 may also include a central member 680 interposing and contacting the MRAM stacks 662, 665. The central member 680 may be substantially similar in composition and manufacture to the central member 580 described above. For example, the central member 680 may comprise magnetic, electrically conductive, and/or dielectric material, as may be needed to interconnect the MRAM stacks 660, 662, 665, 667.

Figure 7:
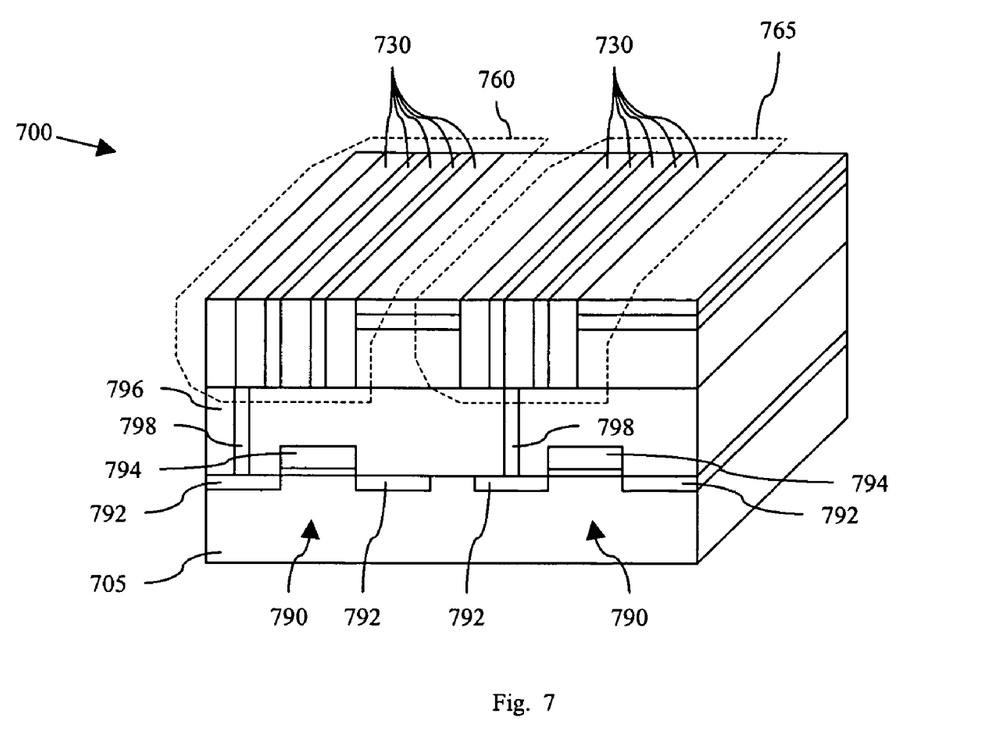
FIG. 7 is a perspective view of at least a portion of another embodiment of the apparatus shown in FIG. 3e.

Referring to FIG. 7, illustrated is a perspective view of at least a portion of one embodiment of an apparatus 700 according to aspects of the present disclosure. The apparatus 700 is one environment in which any of the above-described apparatus 300, 400, 500, 600 may be implemented. The apparatus 700 includes one or more MRAM cells 760, 765, each of which may be substantially similar in composition and manufacture to the MRAM cell 370 shown in FIG. 3e. In the embodiment shown in FIG. 7, the apparatus 700 includes two MRAM cells 760, 765. However, in other embodiments, the apparatus 700 may include only one of the MRAM cells 760, 765, or may include more than the two MRAM cells 760, 765 shown in FIG. 7.

The apparatus 700 also includes a material layer 710 formed over a substrate 705, each of which may be substantially similar in composition and manufacture to the material layer 310 and substrate 305 described above, respectively. For example, the material layer 710 includes a recess corresponding to each of the MRAM cells 760, 765, wherein sidewalls 717 of each of the recesses are substantially perpendicular to the substrate 705. In other embodiments, the recess sidewalls 717 may be oriented at an acute angle relative to the substrate 705, such as an angle ranging between about 60 degrees and about 88 degrees. The recess sidewalls 717 may be substantially planar as in the embodiment illustrated in FIG. 7, substantially cylindrical as in an embodiment illustrated in FIG. 8 and discussed below, or otherwise shaped. The material layer 705, or portions 799 thereof, may also be electrically conductive, such that the MRAM cells 760, 765 may be electrically coupled.

The MRAM cells 760, 765 may be formed so as to substantially conform to the recess sidewalls 717, as in embodiments described above. Thus, each of the MRAM cells 760, 765 may also oriented substantially perpendicular to the substrate.

The apparatus 700 may also include one or more microelectronic devices 790, possibly interconnected with one or more of the MRAM cells 760, 765. For example, in the illustrated embodiment, the microelectronic devices 790 are field effect transistors each having source/drain regions 792 formed in the substrate 705 and gate electrodes 794 formed in a dielectric layer 796 formed over the substrate 705. However, other types of microelectronic devices 790 may also be employed within the scope of the present disclosure. For example, the microelectronic devices 790 may be or comprise transistors other than field effect transistors, or other active or passive microelectronic devices. The apparatus 700 may also include conventional or future-developed interconnects 798 interconnecting the MRAM cells 760, 765 and/or the microelectronic devices 790. For example, ones of the interconnects 798 may each couple at least indirectly to the magnetic layers of the MRAM cells 760, 765. As such, the apparatus 700 may be, comprise or at least partially compose a memory cell array and/or other type of integrated circuit device.

Figure 8:
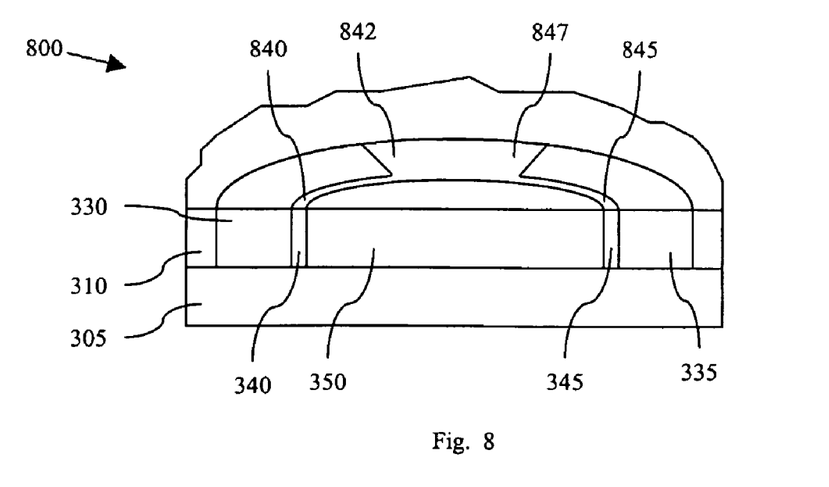
FIG. 8 is a perspective view of at least a portion of one embodiment of the apparatus shown in FIG. 3e.

Referring to FIG. 8, illustrated is a perspective view of at least a portion of another embodiment of the apparatus 300 shown in FIG. 3e, herein designated by the reference number 800. The apparatus 800 is substantially similar in composition and manufacture to the apparatus 300. However, because the apparatus 300 is illustrated in FIG. 3e in sectional view, the footprint of the apparatus 300 is not visible. FIG. 8 is provided, among other reasons, to demonstrate that each of the MRAM stack layers 330, 340, 350, 345, 335, the MRAM stacks 360, 365, and/or the MRAM cell 370 may have a round, elliptical, oval, semi-circular, arcuate, or otherwise non-rectilinear footprint relative to the substrate 305.

For example, in the embodiment shown in FIG. 8, the magnetic MRAM stack layer 350 has a substantially oval-shaped footprint, the dielectric MRAM stack layers 340, 345 have substantially oval-shaped annulus portions 840, 845 and annulus segment portions 842, 847, and the shape of the footprint of each of the magnetic MRAM stack layers 330, 335 is substantially similar to a sector annulus. A sector annulus, at least according to one embodiment within the scope of the present application, is the portion of a sector that is radially outward of the intersection of the sector and a concentric, smaller-radius arc relative to the curved portion of the sector boundary. The embodiment shown in FIG. 8 also illustrates that the dielectric MRAM stack layers 340, 345 may be regions of a single dielectric component.

Figure 9:
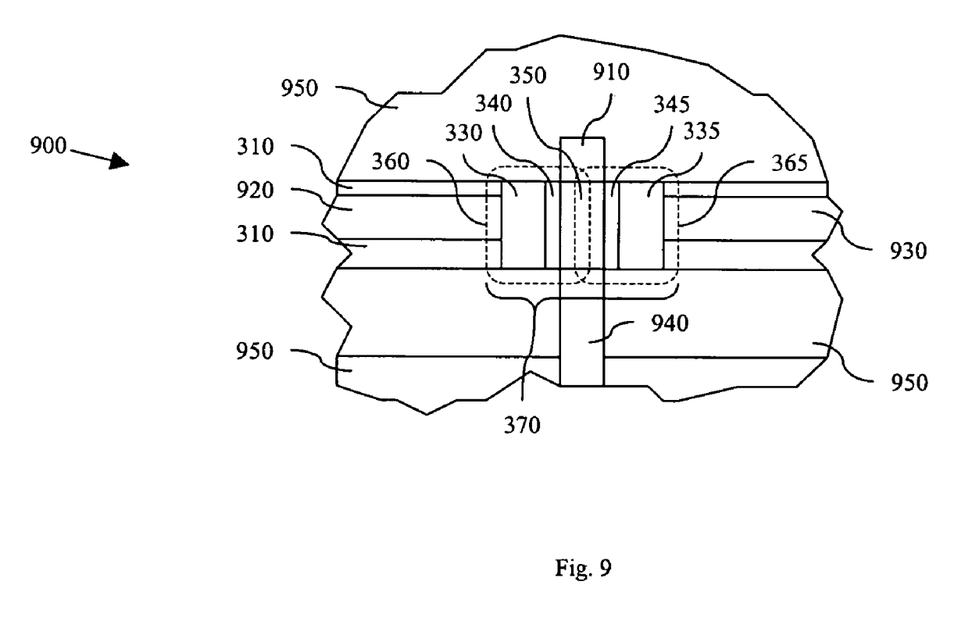
FIG. 9 is a sectional view of at least a portion of one embodiment of the apparatus shown in FIG. 3e.

Referring to FIG. 9, illustrated is a sectional view of at least a portion of another embodiment of the apparatus 300 shown in FIG. 3e, herein designated by the reference number 900. The apparatus 900 is substantially similar in composition and manufacture to the apparatus 300, and is one environment in which the apparatus 300, 400, 500, 600, 700, 800 described above may be implemented. In one embodiment, the apparatus 900 is or comprises an MRAM cell, such as in the embodiments described in reference to FIGS. 1 and 2.

In the embodiment shown in FIG. 9, the apparatus 900 includes a dual-bit MRAM cell 370 comprising a first-bit MRAM stack 360 and a second-bit MRAM stack 365. The first-bit MRAM stack 360 includes magnetic layer or electrode (hereafter referred to as a layer) 330, magnetic layer 350, and tunnel barrier 340, thereby forming a tunnel junction of an MTJ stack. One of the magnetic layers 330, 350 is a free magnetic layer, and the other of the magnetic layers 330, 350 is a fixed or pinned layer. The second-bit MRAM stack 365 includes magnetic layer 335, magnetic layer 350, and tunnel barrier 345, thereby forming a tunnel junction of an additional MTJ stack. If the magnetic layer 330 is a free magnetic layer, the magnetic layer 335 may also be a free layer, and the magnetic layer 350 may be a fixed or pinned magnetic layer. In another embodiment, the magnetic layer 330 may be a fixed or pinned magnetic layer, such that the magnetic layer 335 may also be a fixed or pinned magnetic layer, and the magnetic layer 350 may be a free magnetic layer.

The apparatus 900 also includes a conductive member 910 electrically connected at least indirectly to the magnetic MRAM layer 350. The conductive member 910 may be a bit or digital line in an MRAM array, or may be electrically connected at least indirectly to such a line. The apparatus 900 also includes a conductive member 920 electrically connected at least indirectly to the magnetic MRAM layer 330. The conductive member 920 may be a word or digital line in an MRAM array, or may be electrically connected at least indirectly to such a line. The apparatus 900 also includes a conductive member 930 electrically connected at least indirectly to the magnetic MRAM layer 335. The conductive member 930 may be an additional word or digital line in an MRAM array, or may be electrically connected at least indirectly to such a line. The apparatus 900 also includes one or more conductive members 940 coupled at least indirectly to the magnetic MRAM layer 350, possibly opposite the conductive member 910, as in the embodiment shown in FIG. 9. The one or more conductive members 940 may electrically connect the magnetic MRAM layer 350 to one or more microelectronic devices, such as the microelectronic devices 790 described above.

The conductive members 910, 920, 930, 940 may each comprise aluminum, gold, tungsten, alloys thereof, and/or other electrically conductive materials, and may be formed by one or more CVD or other deposition processes. The conductive members 910, 920, 930, 940 may also each be formed in or otherwise extend within or along a dielectric layer. For example, in the illustrated embodiment, the conductive members 920, 930 extend within material layer 310 which, as described above, may comprise one or more dielectric materials, such as silicon dioxide, TEOS, glass, SILK, BLACK DIAMOND, and/or other electrically insulating materials. Similarly, the conductive members 910, 940 extend within dielectric layers 950 which may comprise similar electrically insulating materials formed by one or more CVD or other deposition processes.

Thus, the present disclosure provides an apparatus including, in at least one embodiment, two first magnetic layers each oriented over a substrate, a second magnetic layer interposing the two first magnetic layers, and two dielectric layers each contacting the second magnetic layer and interposing the second magnetic layer and one of the two first magnetic layers, wherein each of the first and second magnetic layers and the dielectric layers are substantially perpendicular to the substrate. In another embodiment, each of the first and second magnetic layers and the dielectric layers are oriented at an acute angle relative to the substrate, instead of perpendicular.

Another embodiment of an apparatus according to aspects of the present disclosure includes a first magnetic layer, a first dielectric layer located adjacent the first magnetic layer, and a second magnetic layer located adjacent the first dielectric layer and opposite the first magnetic layer. A second dielectric layer is located adjacent the second magnetic layer and opposite the first dielectric layer. A third magnetic layer is located adjacent the second dielectric layer and opposite the second magnetic layer. The first, second and third magnetic layers and the first and second dielectric layers are each located over a substrate, and may be oriented substantially perpendicular to the substrate or at an acute angle relative to the substrate.

Another embodiment of an apparatus according to aspects of the present disclosure includes a dual-bit MRAM cell located over a substrate and including a first-bit MRAM stack and a second-bit MRAM stack each oriented substantially perpendicular to the substrate. In such an embodiment, the first-bit MRAM stack includes first and second magnetic layers and a first dielectric layer interposing the first and second magnetic layers, and the second-bit MRAM stack includes the second magnetic layer, a third magnetic layer, and a second dielectric layer interposing the second and third magnetic layers.

The present disclosure also introduces an apparatus including a dual-bit MRAM cell located over a substrate and including first and second magnetic tunnel junction (MTJ) stacks which share a shared magnetic layer, wherein the shared magnetic layer is oriented substantially perpendicular to the substrate. In a similar embodiment, the shared magnetic layer is angularly offset from the substrate at an acute angle, such as one ranging between about 60 degrees and about 88 degrees.

A method introduced in the present disclosure includes, in at least one embodiment, exposing a portion of a substrate by forming a recess in a material layer located over the substrate, the recess having opposing first and second sidewalls oriented substantially perpendicular to the substrate. Such a method also includes partially filling the recess by forming first and second magnetic layers each lining and conforming to the first and second recess sidewalls, respectively. The recess is partially filled further by forming first and second dielectric layers each lining and conforming to the first and second magnetic layers, respectively. The recess is substantially filled by forming a third magnetic layer interposing and contacting the first and second dielectric layers.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that these and other such equivalent constructions do not depart from the spirit and scope of the present disclosure, and that they may make various changes, substitutions and alterations herein without departing from the spirit and scope of the present disclosure.

What is claimed is:

1. An apparatus, comprising:
   two first magnetic layers each oriented over a substrate;
   a second magnetic layer interposing the two first magnetic layers; and
   two dielectric layers contacting opposing sides of the second magnetic layer and each interposing the second magnetic layer and one of the two first magnetic layers, wherein each of the first and second magnetic layers and the dielectric layers are non-parallel relative to the substrate;
   wherein each of the first and second magnetic layers and the dielectric layers are oriented at an acute angle relative to the substrate.

2. The apparatus of claim 1 wherein the acute angle ranges between about 60 degrees and about 88 degrees.

3. The apparatus of claim 1 further comprising a material layer located over the substrate and having a recess therein, wherein the first and second magnetic layers and the dielectric layers each conform to a sidewall of the recess oriented at the acute angle relative to the substrate.

4. The apparatus of claim 1 wherein each of the first and second magnetic layers comprise an alloy including Fe and at least one of Ni and Co.

5. The apparatus of claim 1 wherein the first and second magnetic layers and the dielectric layers collectively compose one dual-bit MRAM cell in a plurality of substantially similar dual-bit MRAM cells located over the substrate.

6. The apparatus of claim 1 further comprising at least one microelectronic device located at least partially in at least one of the substrate and a layer interposing the substrate and ones of the first and second magnetic layers and the dielectric layers, wherein the at least one microelectronic device is electrically coupled to at least one of the first and second magnetic layers.

7. An apparatus, comprising:
   a first magnetic layer;
   a first dielectric layer located adjacent the first magnetic layer;
   a second magnetic layer located adjacent the first dielectric layer and opposite the first magnetic layer;
   a second dielectric layer located adjacent the second magnetic layer and opposite the first dielectric layer; and
   a third magnetic layer located adjacent the second dielectric layer and opposite the second magnetic layer;
   wherein the first, second and third magnetic layers and the first and second dielectric layers are each oriented at an acute angle relative to a substrate.

8. The apparatus of claim 7 wherein the acute angle ranges between about 60 degrees and about 88 degrees relative to the substrate.

9. The apparatus of claim 7 further comprising a material layer located over the substrate and having a recess therein, wherein the first, second and third magnetic layers and the first and second dielectric layers each conform to a sidewall of the recess that is oriented at the acute angle relative to the substrate.

10. The apparatus of claim 7 wherein each of the first, second and third magnetic layers comprises an alloy including Fe and at least one of Ni and Co.

11. The apparatus of claim 7 wherein the first, second and third magnetic layers and the first and second dielectric layers collectively compose one dual-bit MRAM cell in a plurality of substantially similar dual-bit MRAM cells located over the substrate.

12. The apparatus of claim 7 further comprising at least one microelectronic device located at least partially in at least one of the substrate and a layer interposing the substrate and ones of the first, second and third magnetic layers and the first and second dielectric layers, wherein the at least one microelectronic device is electrically coupled to at least one of the first, second and third magnetic layers.

13. An apparatus, comprising:
   a dual-bit MRAM cell located over a substrate and including a first-bit MRAM stack and a second-bit MRAM stack each oriented at an acute angle relative to the substrate;
   wherein the first-bit MRAM stack includes:
      first and second magnetic layers; and
      a first dielectric layer interposing the first and second magnetic layers; and
   wherein the second-bit MRAM stack includes:
      the second magnetic layer;
      a third magnetic layer; and
      a second dielectric layer interposing the second and third magnetic layers.

14. The apparatus of claim 13 wherein the acute angle ranges between about 60 degrees and about 88 degrees relative to the substrate.

15. The apparatus of claim 13 further comprising a material layer located over the substrate and having a recess therein, wherein the first, second and third magnetic layers and the first and second dielectric layers each conform to a sidewall of the recess oriented at the acute angle relative to the substrate.

16. The apparatus of claim 13 wherein each of the first, second and third magnetic layers comprises an alloy including Fe and at least one of Ni and Co.

17. The apparatus of claim 13 wherein the dual-bit MRAM cell is one of a plurality of substantially similar dual-bit MRAM cells located over the substrate.

18. The apparatus of claim 13 further comprising at least one microelectronic device located at least partially in at least one of the substrate and a layer interposing the substrate and ones of the first, second and third magnetic layers and the first and second dielectric layers, wherein the at least one microelectronic device is electrically coupled to at least one of the first, second and third magnetic layers.

19. An apparatus, comprising:
   a dual-bit MRAM cell located over a substrate and including first and second magnetic tunnel junction (MTJ) stacks which share a shared magnetic layer, the shared magnetic layer oriented at an acute angle relative to the substrate.

20. The apparatus of claim 19 further comprising a material layer located over the substrate and having a recess therein, wherein the first and second MTJ stacks are located in the recess and each conform to a sidewall of the recess oriented at the acute angle relative to the substrate.

21. The apparatus of claim 19 wherein the dual-bit MRAM cell is one of a plurality of substantially similar dual-bit MRAM cells located over the substrate.

22. The apparatus of claim 19 further comprising a plurality of interconnects each coupled at least indirectly to one of the first and second MTJ stacks.

23. The apparatus of claim 19 further comprising at least one microelectronic device located at least partially in at least one of the substrate and a layer interposing the substrate and ones of the first and second MTJ stacks, wherein the at least one microelectronic device is electrically coupled to at least one of the first and second MTJ stacks.

24. The apparatus of claim 19 wherein:

the first MTJ stack includes a first dedicated magnetic layer and a first tunneling barrier layer;

the first tunneling barrier layer interposes the first dedicated magnetic layer and the shared magnetic layer;

the second MTJ stack includes a second dedicated magnetic layer and a second tunneling barrier layer; and the second tunneling barrier layer interposes the second dedicated magnetic layer and the shared magnetic layer.

25. The apparatus of claim 24 wherein the first and second dedicated magnetic layers and the first and second tunneling barrier layers are each oriented at the acute angle relative to the substrate.

26. The apparatus of claim 24 wherein each of the first, second and third magnetic layers comprises an alloy including Fe and at least one of Ni and Co.

* * * * *